United States Patent
Ghosh et al.

(10) Patent No.: US 7,139,929 B2
(45) Date of Patent: Nov. 21, 2006

(54) GENERATING A TEST ENVIRONMENT FOR VALIDATING A NETWORK DESIGN

(75) Inventors: Indradeep Ghosh, San Jose, CA (US); Liang Zhang, Blacksburg, VA (US)

(73) Assignee: Fujitsu Limited, Kawasaki (JP)

( * ) Notice: Subject to any disclaimer, the term of this patent is extended or adjusted under 35 U.S.C. 154(b) by 551 days.

(21) Appl. No.: 10/405,768

(22) Filed: Apr. 1, 2003

(65) Prior Publication Data
US 2004/0199807 A1 Oct. 7, 2004

(51) Int. Cl.
G06F 11/00 (2006.01)
(52) U.S. Cl. .......................................... 714/4
(58) Field of Classification Search .................. None
See application file for complete search history.

(56) References Cited

U.S. PATENT DOCUMENTS

| | | | | |
|---|---|---|---|---|
| 6,086,626 | A * | 7/2000 | Jain et al. ........................ | 716/5 |
| 6,175,946 | B1 * | 1/2001 | Ly et al. ......................... | 716/4 |
| 6,301,687 | B1 * | 10/2001 | Jain et al. ....................... | 716/3 |
| 6,301,701 | B1 * | 10/2001 | Walker et al. ................ | 717/125 |
| 6,324,678 | B1 * | 11/2001 | Dangelo et al. .............. | 716/18 |
| 6,560,758 | B1 * | 5/2003 | Jain ............................... | 716/7 |
| 6,609,229 | B1 * | 8/2003 | Ly et al. ......................... | 716/4 |
| 6,877,141 | B1 * | 4/2005 | Ghosh et al. .................. | 716/4 |
| 2002/0032889 | A1 * | 3/2002 | Ghosh .......................... | 714/738 |

OTHER PUBLICATIONS

Fallah, et al., "Simulation Vector Generation from HDL Descriptions for Observability-Enhanced Statement Coverage," © 1999 ACM 1-58113-092-9/99/0006, 38.1 (pp. 666-671).

Fallah, et al., "Event-Driven Observability Enhanced Coverage Analysis of C Programs for Functional Validation," *ASP-DAC*, Jan. 2003 (six pages).

Ghosh, et al., "Automatic Test Pattern Generation for Functional Register-Transfer Level Circuits Using Assignment Decision Diagrams," 0278-0070(01)01514-7, © 2001 *IEEE Transactions on Computer-Aided Design of Integrated Circuits and Systems*, vol. 20, No. 3, Mar. 2001 (pp. 402-415).

Fallah, et al., "OCCOM-Efficient Computation of Observability-Based Code Coverage Metrics for Functional Verification," 0278-0070(01)05202-2, © 2001 *IEEE Transactions on Computer-Aided Design of Integrated Circuits and Systems*, vol. 20, No. 8, Aug. 2001 (pp. 1003-1014).

Fallah, et al., "Functional Vector Generation for HDL Models Using Linear Programming and Boolean Satisfiability," 0278-0070(01)052023-4, © 2001 *IEEE Transactions on Computer-Aided Design of Integrated Circuits and Systems*, vol. 20, No. 8, Aug. 2001 (pp. 994-1002).

U.S. Appl. No. 10/270,835, filed Oct. 14, 2002, entitled "Event-Driven Ovservability Enhanced Coverage Analysis," 33 total pages.

* cited by examiner

*Primary Examiner*—Bryce P. Bonzo
*Assistant Examiner*—Elmira Mehrmanesh
(74) *Attorney, Agent, or Firm*—Baker Botts L.L.P.

(57) ABSTRACT

Generating a test environment includes accessing initial test environments for a network of nodes, where a test environment specifies a propagation or justification path for a node. The following are repeated until satisfactory coverage is achieved or until a predetermined number of iterations is reached. A coverage for each test environment is calculated, and at least two of the test environments are mated to generate next test environments, where the coverage of the at least two test environments is greater than the coverage of the other test environments.

17 Claims, 5 Drawing Sheets

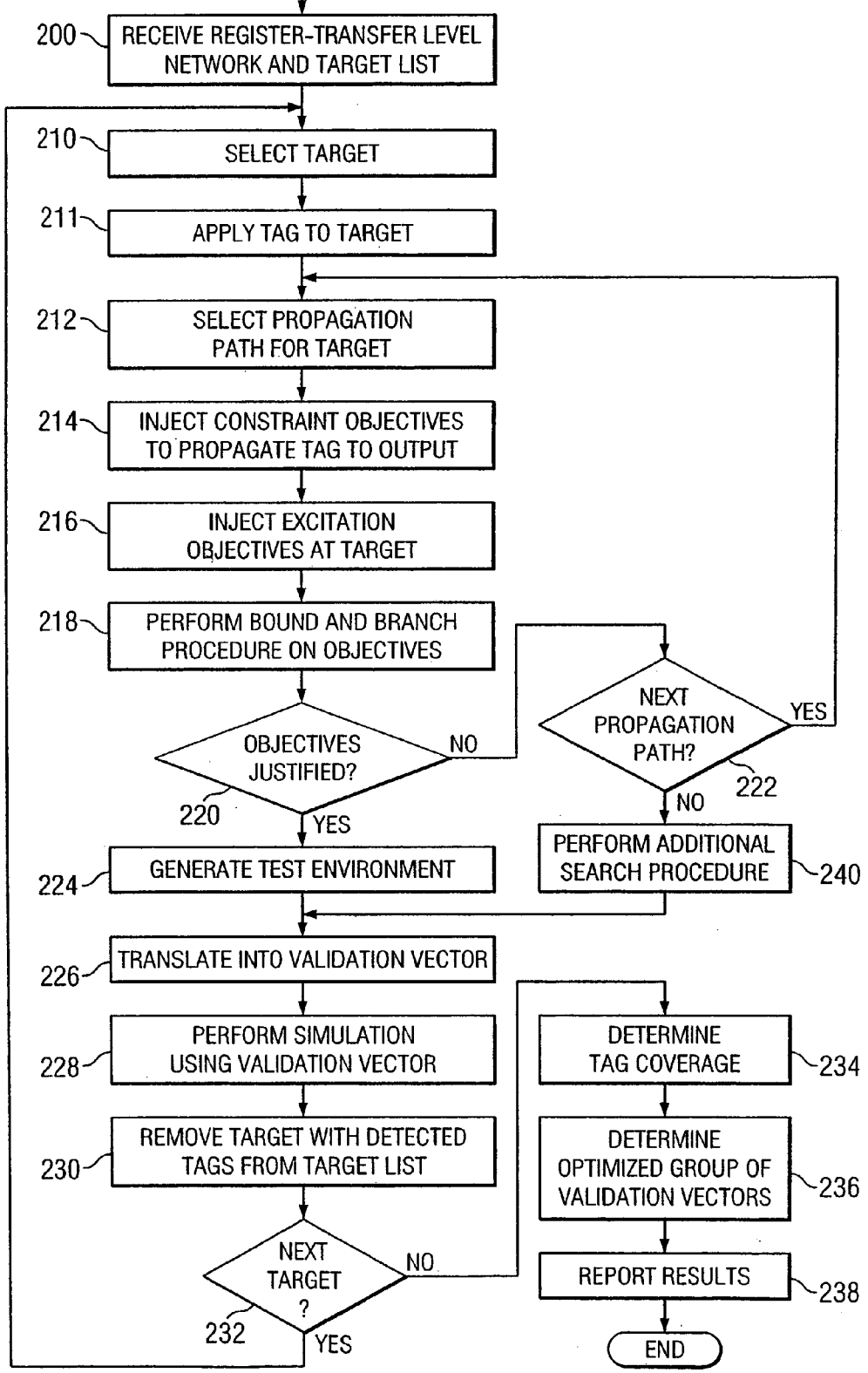

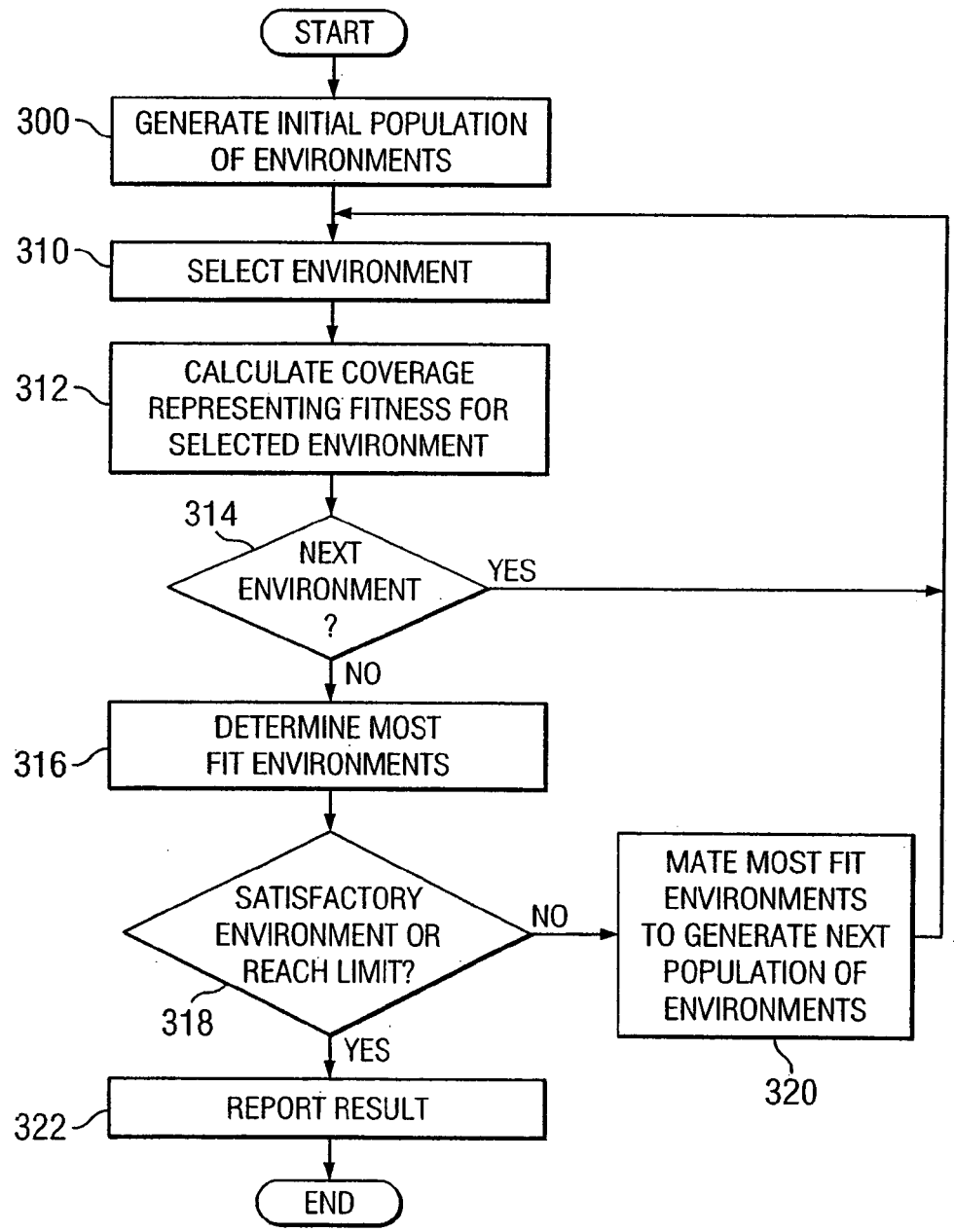

GENERATING A TEST ENVIRONMENT FOR VALIDATING A NETWORK DESIGN

TECHNICAL FIELD OF THE INVENTION

This invention relates generally to the field of integrated circuit design and more specifically to generating a test environment for validating a network design.

BACKGROUND OF THE INVENTION

Advances in circuit technology have provided for the placement of significantly more transistors on an integrated circuit, which requires more complicated circuit design. Known techniques for evaluating circuit design, however, are typically inefficient when faced with the more complicated circuit designs. Consequently, known techniques for evaluating circuit design may be unsatisfactory in certain situations.

SUMMARY OF THE INVENTION

In accordance with the present invention, disadvantages or problems associated with previous techniques for evaluating circuit design may be reduced or eliminated.

According to one embodiment of the present invention, generating a test environment includes accessing initial test environments for a network of nodes, where a test environment specifies a propagation path for a node. The following are repeated until satisfactory coverage is achieved or until a predetermined number of iterations is reached. A coverage for each test environment is calculated, and at least two of the test environments are mated to generate next test environments, where the coverage of the at least two test environments is greater than the coverage of the other test environments.

Certain embodiments of the invention may provide one or more technical advantages. A technical advantage of one embodiment may be that error propagation using an unsigned tag may provide for more accurate verification of a validation vector used for testing a circuit design. A technical advantage of another embodiment may be that validation vectors may be generated and evaluated at the register-transfer level. Evaluating validation vectors at the register-transfer level may be more efficient than evaluating the validation vectors at the logic level. A technical advantage of yet another embodiment may be that a genetic search process may be used to generate test environments for validation vectors.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 5 is a flowchart illustrating one embodiment of a method for evaluating validation vectors;

FIG. 7 is a flowchart illustrating one embodiment of a method for generating test environments.

DETAILED DESCRIPTION OF THE DRAWINGS

Embodiments of the present invention and its advantages are best understood by referring to FIGS. 1 through 7 of the drawings, like numerals being used for like and corresponding parts of the various drawings.

Figure 1:
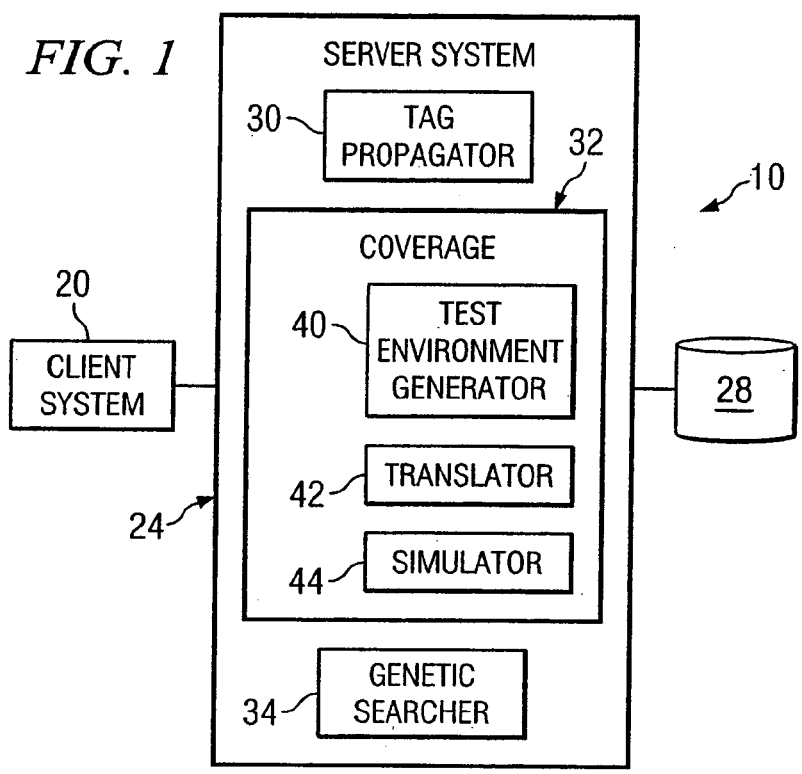
FIG. 1 is a block diagram of a system for evaluating circuit design.

FIG. 1 is a block diagram of a system 10 for evaluating circuit design. In general, system 10 may provide for propagating a tag representing an error through a network of a circuit in order to analyze the design of the network. The tag may, for example, designate a positive error, a negative error, or an unsigned error of a value of a variable. System 10 may also provide for generating and evaluating validation vectors that may be used to propagate tags during design analysis. The validation vectors may be generated and evaluated at the register-transfer level (RTL) by generating test environments, translating the test environments to validation vectors, and evaluating the validation vectors. Test environments may be generated according to, for example, a genetic search process.

According to one embodiment, system 10 may be used to analyze a network comprising a register-transfer level circuit design expressed in, for example, Very High Speed Integrated Circuits (VHSIC) Hardware Description Language (VHDL) or VERILOG, which may be used in the process of designing a circuit. A register-transfer level network may be represented as a network of nodes and edges. The nodes may include inputs, outputs, operations, and variables, and the edges may represent data dependencies.

A register-transfer level design may be one of a sequence of designs produced during the design of a circuit, starting with a behavioral level design. A behavioral level design may be described in written text or in a software programming language such as C. The behavioral level design may be translated into a register-transfer level design comprising arithmetic and logic operations. A gate netlist comprising logic may be generated from the register-transfer level design, and may be used to form a die for the circuit.

In order for the circuit to perform according to the behavioral design, typically the register-transfer level design is validated against the behavioral design, and the netlist is validated against the register-transfer-level design. Validation vectors are typically used to perform the validation, and are evaluated with respect to certain features. For example, validation vectors should be able to detect most if not all errors of a network. Errors are modeled by assigning a tag representing an error to a value of a variable at a node of the network. The tag is propagated according to a propagation path and input values specified by the validation vector. An error is detected if an error effect is propagated to an output. A set of one or more validation vectors may be designated as more effective if the vectors of the set can be used to detect more errors. Additionally, validation vectors should be able to detect problem areas such as corner case bugs.

According to the illustrated embodiment, system 10 includes a client system 20, a server system 24, and a database 28 coupled as shown in FIG. 1. According to one embodiment, client system 20 allows a user to communicate with server system 24 to evaluate circuit design. Server system 24 manages applications that evaluate circuit design, such as a tag propagator 30, a coverage module 32, and a genetic searcher 34. Tag propagator 30 propagates a tag representing an error through a network in order to analyze the design of the network, and coverage module 32 generates and evaluates validation vectors at the register-transfer level, and may use genetic searcher 34 to generate some validation vectors.

Tag propagator 30 propagates a tag representing an error through a network in order to analyze the design of the network. A tag may be injected at a node representing a variable assignment statement or a branch condition, and may be propagated according to a set of rules to an output such that the error effect of the tag may be observed. Tag propagator 30 may propagate a tag according to the method described with reference to FIG. 2.

Different tags may be used to represent different types of errors of the values of the variables at the nodes. For example, the following tags may be used:

(a) No tag represents that the correct value of a variable is the current value;

(b) Positive tag +Δ represents that the correct value of a variable or expression is more than the current value;

(c) Negative tag −Δ represents that the correct value of a variable or expression is less than the current value;

(d) Unsigned tag U represents that the correct value of the variable or expression is different that current value, but its sign is not known; and (e) Unknown tag ? represents that it is unclear whether the value at the location is correct or not.

As values having tags are propagated through the nodes of a network, operations may be performed on the values and tags that transform the tags as well as the values. A transformation table specifies how a tag may be transformed by a particular operation. TABLE 1 is an example transformation table illustrating how a tag propagated through an adder may be transformed by the addition operation. TABLE 1 is shown as an example for illustration purposes only.

TABLE 1

| ADDER | b | b + Δ | b − Δ | b + U | b + ? |
| --- | --- | --- | --- | --- | --- |
| a | a + b | a + b + Δ | a + b − Δ | a + b + U | a + b + ? |
| a + Δ | a + b + Δ | a + b + Δ | a + b + U | a + b + U | a + b + U |
| a − Δ | a + b − Δ | a + b + U | a + b − Δ | a + b + U | a + b + U |
| a + U | a + b + U | a + b + U | a + b + U | a + b + U | a + b + U |
| a + ? | a + b + ? | a + b + U | a + b + U | a + b + U | a + b + ? |

As illustrated by TABLE 1, the following combinations of input tags may result in a resulting unsigned tag: a positive tag and a negative tag, at least one unsigned tag, or at least one unknown tag. Other suitable combinations, however, may be used.

Unsigned tag U representing an unsigned error may provide for more efficient detection of errors since unsigned tag U is typically propagated through a network better than unknown tag ?. As an example, the following example code is presented:

Case (a)
  when 0:b<=7;
  when 1:b<=4;
  when 2:b<=10;
  default:b<=1;
endcase.
display (b);

In this example, say the simulation value of a is zero. If unsigned tag U is not used, a value $a^{0+\Delta}$ results in a value $b^{7+?}$, which does not reveal the error at the output. If unsigned tag U is used, the value $a^{0+\Delta}$ results in the value $b^{7+U}$, which reveals the error.

Coverage module 32 generates and evaluates validation vectors at the register-transfer level. Unlike some known techniques, coverage module 32 does not require running a fault simulation at the logic level in order to evaluate the validation vectors. Coverage module 32 includes a test environment generator 40, a translator 42, and a simulator 44. Test environment generator 40 generates test environments for validation targets, translator 42 translates the test environments into validation vectors, and simulator 44 simulates tag propagation in order to determine coverage of the validation vectors.

Test environment generator 40 generates a test environment that specifies conditions that provide controllability and observability of a validation target. A test environment may be specify a propagation path starting from an input, traversing through the target, and reaching an output. The propagation path is issued to deliver excitation objectives to the target and propagate an error effect to an output. The test environment may include test sequences that specify, for example, variable assignments, conditional statements, and expressions at the register-transfer level.

According to one embodiment, test environment generator 40 may use a set of controllabilities that are sufficient to justify a constant from a target node to an input or from a target node to an output. The set of controllabilities may include, for example, the following controllabilities:

(a) Controllability C0 to zero of a variable represents the ability to control the variable to the value 0, for example, the "000 . . . 00" value in case of multibit variables or the zero value in case of a single bit variable;

(b) Controllability Cl to one of a variable represents the ability to control the variable to the value 1, for example, the "000 . . . 01" value in case of multibit variables or the one value in case of a single bit variable;

(c) Controllability Cal to all ones of a variable represents the ability to control the variable to the value all ones, for example, the "111 . . . 11" value in case of multibit variables. In case of two's compliment arithmetic, it also means controllability to the −1 value;

(d) Controllability Cq to a constant of a variable represents the ability to control the variable to any fixed constant value. In case of an n-bit variable, the ability may comprise the ability to control the n-bit variable to any one constant value out of the $2^n$ values possible on the variable. In case of a single-bit variable, the ability may comprise the ability to control the single-bit variable to either the zero or one value;

(e) Controllability Cz to the Z value of a variable represents the ability to control the variable to a high-impedance Z state. In case of an n-bit variable, the ability may comprise the ability to control the variable to the "ZZZ . . . Z" vector;

(f) Controllability Cs to a state of a state variable represents the ability to control the variable to a particular state;

(g) Observability O of a variable represents the ability to observe a fault at a variable. In case of a multibit variable, observability signifies that a faulty value that is different from the correct value is present at the variable. In case of a single-bit value, observability signifies the good value on the variable is one and the faulty value is zero; and (h) Complement observability O' is defined for single-bit variables only, and signifies that the good value on the variable is zero and the faulty value is one.

Genetic searcher 34 performs a genetic search to generate complete test environments from partial test environments. According to one embodiment, genetic searcher 34 receives a partial test environment from test generator 40. An initial population of test environments is generated from the partial environment, and the coverage is determined for each of the generated test environments. If the coverage is not satisfactory, the test environments are mated to generated new test environments.

Client system 20 and server system 24 may each operate on one or more computers and may include appropriate input devices, output devices, mass storage media, processors, memory, or other components for receiving, processing, storing, and communicating information according to the operation of system 10. "Each" as used in this document refers to each member of a set or each member of a subset of a set. As used in this document, the term "computer" refers to any suitable device operable to accept input, process the input according to predefined rules, and produce output, for example, a personal computer, work station, network computer, wireless telephone, personal digital assistant, one or more microprocessors within these or other devices, or any other suitable processing device.

Client system 20 and server system 24 may be integrated or separated according to particular needs. For example, the present invention contemplates the functions of both client system 20 and server system 24 being provided using a single computer system, for example, a single personal computer. If client system 20 and server system 24 are separate, client system 20 may be coupled to server system 24 using one or more local area networks (LANs), metropolitan area networks (MANs), wide area networks (WANs), a global computer network such as the Internet, or any other appropriate wire line, wireless, or other links.

A database 28 stores data that may be used by server system 24. Database 28 may be local to or remote from server system 24, and may be coupled to server system 24 using one or more local area networks (LANs), metropolitan area networks (MANs), wide area networks (WANS), a global computer network such as the Internet, or any other appropriate wire line, wireless, or other links.

Modifications, additions, or omissions may be made to the system without departing from the scope of the invention. Moreover, the operation of the system may be performed by more or fewer modules. For example, the operation of tag propagator 30 and coverage module 32 may be performed by one module, or the operation of coverage module 32 may be performed by more than one module. Additionally, functions may be performed using any suitable logic comprising software, hardware, other logic, or any suitable combination of the preceding.

Figure 2:
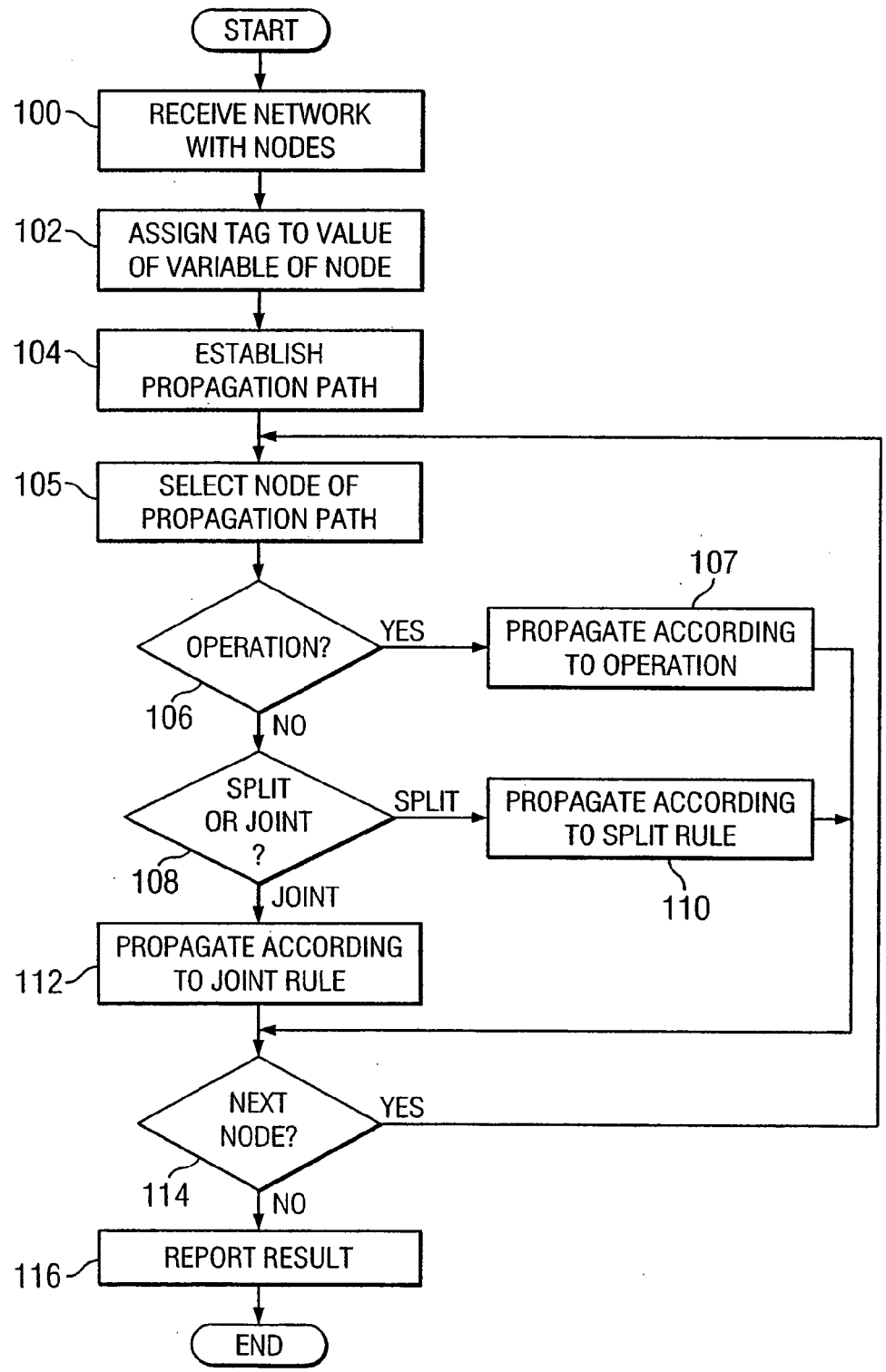
FIG. 2 is a flowchart illustrating one embodiment of a method for propagating a tag.

FIG. 2 is a flowchart illustrating one embodiment of a method for propagating a tag. The tag represents an error, and may be propagated from a target node to an output to determine an error effect of the tag. The method begins at step 100, where a network including one or more nodes is received. The network may represent a register-transfer level design of a circuit. A tag is assigned to a value of a variable associated with a node of the network during simulation with a test set at step 102. A propagation path through the node is established at step 104.

A node of the propagation path is selected at step 105. If the node performs an operation at step 106, the method proceeds to step 107, where the tag is propagated according to the operation. Propagation tables such as TABLE 1 may be used to determine how to propagate the tag according to the operation. After propagating the tag, the method proceeds to step 114. If the node does not perform an operation at step 104, the method proceeds to step 108. If the node is a split node at step 108, the method proceeds to step 110 where the tag is propagated according to the split rule.

Figure 3:
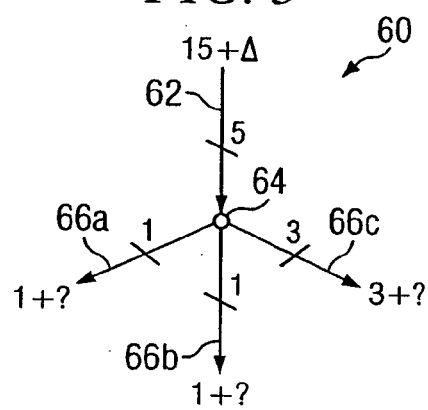
FIG. 3 is a diagram illustrating one example of propagating a tag according to a split rule.

FIG. 3 is a diagram 60 illustrating one example of propagating a tag according to a split rule. Input edge 62 is split at a node 64 to yield output edges 66a–c. If the value at an input edge 62 has an error, the resulting output edges 66a–c may have unknown errors. In the illustrated example, input edge 62 has a signed tag $\Delta$, so the values at output edges 66a–c have unknown tags ?.

Referring back to FIG. 2, after propagating a tag according to a split rule, the method then proceeds to step 114. If the node is a joint node at step 108, the method proceeds to step 112, where the tag is propagated according to the joint rule.

Figure 4:
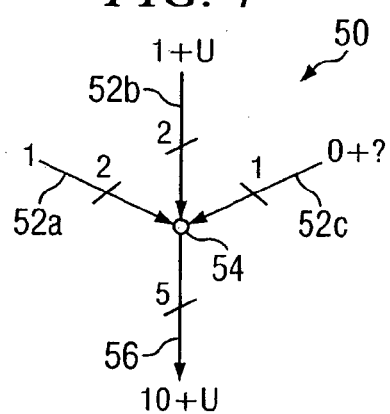
FIG. 4 is a diagram illustrating one example of propagating a tag according to a joint rule.

FIG. 4 is a diagram 50 illustrating one example of propagating a tag according to a joint rule. Input edges 52a–c are joined at a node 54 to yield an output edge 56. According to the illustrated example, if a value of any input edge 52a–c has a unsigned tag U representing an unsigned error, the value at output edge 56 may have an unsigned tag U. In the illustrated example, input edge 52b has an unsigned tag U. Hence, output edge 56 also has an unsigned tag U since tag ? of edge 52c is masked by tag U in higher order bits of edge 56.

Referring back to FIG. 2, after propagating a tag according to a joint rule, the method then proceeds to step 114. If there is a next node at step 114, the method returns to step 106 to select the next node of the propagation path. If there is no next node, the method proceeds to step 116, where the results of the tag propagation are reported. After reporting the results, the method terminates.

Modifications, additions, or omissions may be made to the method without departing from the scope of the invention. For example, other rules may be used to propagate the tags. Additionally, steps may be performed in any suitable order without departing from the scope of the invention.

FIG. 5 is a flowchart illustrating one embodiment of a method for evaluating validation vectors. The validation vectors may be evaluated at the register-transfer level by generating test environments, translating the test environments to validation vectors, and evaluating the validation vectors. For illustration purposes only, the method is described using a network illustrated in FIG. 6 and the following code segment:

```
if RST = '1' then
    a:=1; b:=1; c:=0; out:=0; i:=0;
elseif clk'event and clk = '1' then
    i:=i+1;
    if (i=1) then
        a := ina + 3;
        b := inb;
    elseif (i=2) then
        c := a * b;
    elseif (i=3) then
        out := c;
    endif;
endif;
```

The method, however, may be used with any suitable network or code segment.

Figure 6:
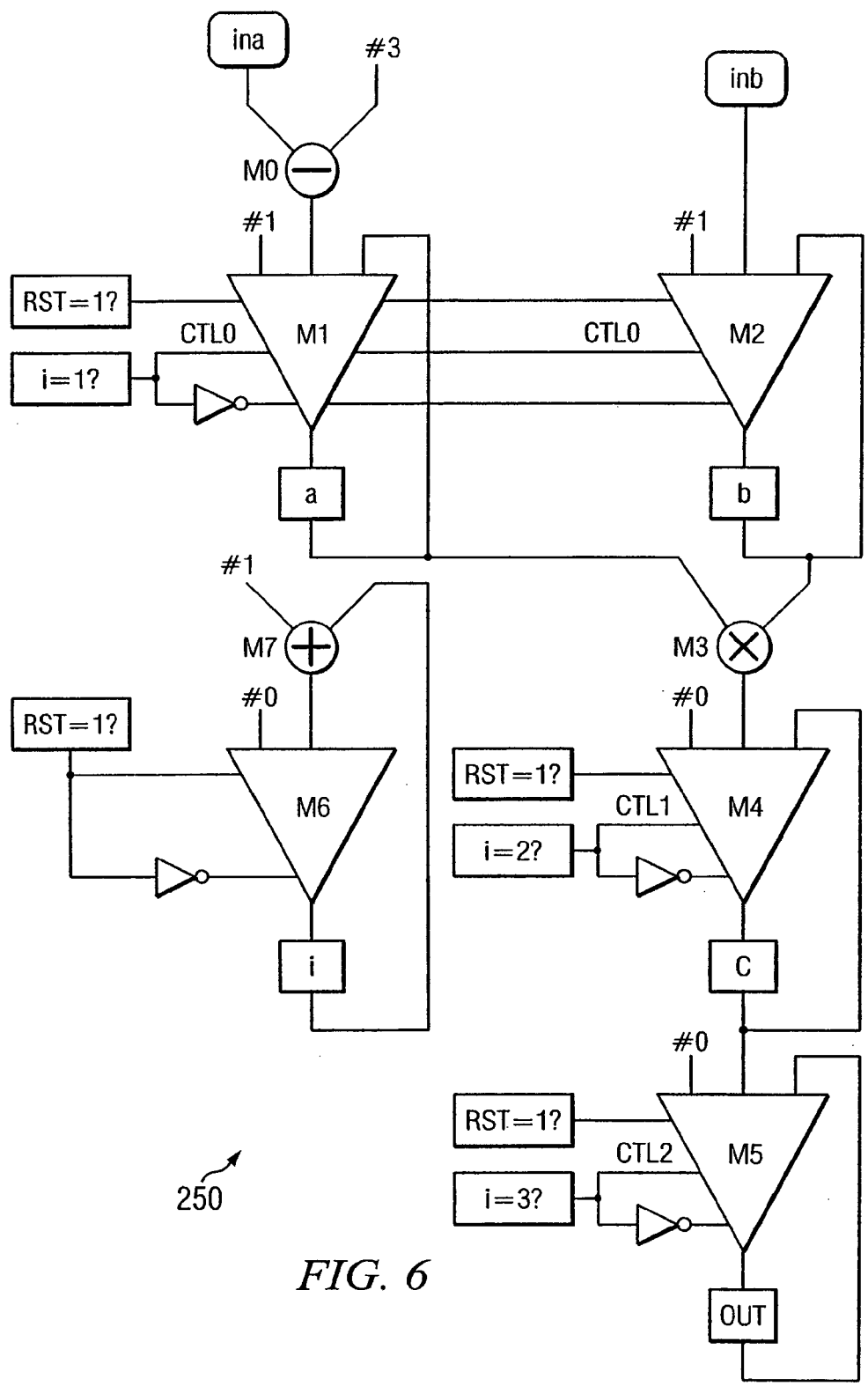
FIG. 6 illustrates an example network that may be used with the method described with reference to FIG. 5.

FIG. 6 illustrates an example network 250 that may be used with the method described with reference to FIG. 5.

Referring back to FIG. 5, the method begins at step 200, where a register-transfer level network and a target list are received. The network may comprise network 250 described with reference to FIG. 5, and the target list may include constructs of the network such as variable assignments, expressions, or conditional constructs that are to be tested.

A target is selected from the target list at step 210. The targets may be selected in the order of arithmetic operations, logic arrays, assignment decision nodes, random logic, and black boxes, or in any other suitable order. A tag is applied to a value of a variable associated with the selected target at step 211. A propagation path is selected for the target at step 212. The propagation path goes from an input, through the target, to an output. For example, the selected propagation path may comprise the shortest propagation path described by:

M3→M4→C→M5→OUT

Constraint objectives are injected to propagate the tag to an output at step 214. Constraint objectives may be injected at the side-inputs of the propagation path in order to propagate an error effect to an output. According to the illustrated embodiment, constraint objectives may include, for example, algebra-based objectives such as (CTL1, 1, C1), which represents that a C1 algebra is needed at signal CTL1 at time frame 1, and (CTL2, 2, C1) which represents that a C1 algebra is needed at signal CTL2 at time frame 2. Excitation objectives are injected at the target at step 216. Excitation objectives may include algebra-based objectives such as (a, 0, Cg) and (b, 0, Cg), which represent that algebra Cg is needed at signals a and b at time frame 0.

A branch and bound procedure is performed on the objectives at step 218. If the objectives are justified at step 220, the method proceeds to step 224, where a test environment is generated. The test environment may specify a justified algebra on the inputs and the general controllability on the internal nodes. Fan-in nodes for the internal nodes may also be included in the test environment. For example, a test environment may include:

(RST, −2, C1);
(RST, −1, C0);
(ina, −1, Cg);
(M0, −1, Cg): (ina, −1, Cg);
(M1, 0, Cg): (M0, −1, Cg);
(a, 0, Cg): (M1, 0, Cg);
(inb, −1, Cg)
(M2, 0, Cg): (inb, −1, Cg);
(b, 0, Cg): (M2, 0, Cg);
(RST, 0, C0);
(RST, 1, C0);
(RST, 2, C0);

If a complete test environment cannot be derived, the controllability conditions may be relaxed. After generating the test environment, the method proceeds to step 226.

If the objectives are not justified at step 220, the method proceeds to step 222. If there is a next propagation path at step 222, the method returns to step 212 to select the next propagation path. If there is no next propagation path at step 222, the method proceeds to step 240 where an additional search procedure is performed to generate a test environment. An example of an additional search procedure is described with reference to FIG. 7, which may be used to generate a complete test environment from a partial test environment. After performing the additional search procedure, the method proceeds to step 226.

The test environment is translated into a validation vector at step 226. TABLE 2 illustrates steps for translating an example test environment into a validation vector.

TABLE 2

| Time | STEP 1 | | | STEP 2 | | | STEP 3 | | |
|---|---|---|---|---|---|---|---|---|---|
| Frame | RST | ina | inb | RST | ina | inb | RST | ina | inb |
| −2 | 1 | x | x | 1 | x | x | 1 | 2 | 3 |
| −1 | 0 | x | x | 0 | 8 | 10 | 0 | 8 | 10 |
| 0 | 0 | x | x | 0 | x | x | 0 | 1 | 0 |
| 1 | 0 | x | x | 0 | x | x | 0 | 4 | 7 |
| 2 | 0 | x | x | 0 | x | x | 0 | 5 | 5 |

According to the illustrated example, values 5 and 10 are to be applied to the inputs of the multiplier M3. At step one, the controllabilities except the general controllability at the inputs in a and inb are translated. At step two, the value 5 is plugged into (a, 0) and propagated back to the input in a. The value may be propagated back to the input in a according to the trace:

(a,0,Cg)→(M1,0,Cg)→(M0,−1,Cg)→(M0,−1,Cg)→
(ina,−1,Cg)

The values may be adjusted when propagated through certain constructs. For example, the value 5 at (M0, −1) implies a value 8 at (ina, −1), since M0 is a subtractor and the other operand is a constant 3. At step three, random numbers are assigned to the unspecified inputs in a and inb to form fully specified validation vectors. To increase the probability that signal substitution errors at the variables will be detected, the values of the variables may be required to be different from each other.

A simulation is performed using the validation vector at step 228 to determine if the validation vector detects tags other than the tag associated with the selected target. The other tag may be detected if the validation vector receives an input, propagates the input through a target associated with the other tag, and propagates an error effect to an output. Any target with a detected tag is removed from the target list at step 230.

If there is a next target of the target list at step 232, the method returns to step 210 to select the next target. If there is no next target of the target list at step 232, the method proceeds to step 234 to determine tag coverage of the validation vectors. An optimized group of validation vectors may be determined at step 236. The optimized group may provide optimal tag coverage. Results are reported at step 238. After reporting the results, the method terminates.

Modifications, additions, or omissions may be made to the method without departing from the scope of the invention. For example, an optimized group may not be determined at step 236. Additionally, steps may be performed in any suitable order without departing from the scope of the invention.

FIG. 7 is a flowchart illustrating one embodiment of a method for generating test environments. The method begins at step 300, where an initial population of environments is generated. The initial population may be generated using, for example, a partial environment resulting from step 240 of the method described with reference to FIG. 5. In general, an environment may include, for example, a controllability portion comprising a portion of a propagation path from an input to the target, and an observability portion comprising a portion of the propagation path from the target to an output. A partial environment may include, for example, an incomplete controllability portion that does not propagate back to an input, an incomplete observability portion that does not propagate to an output, or both. The partial environment may be mutated to generate an initial population of environments. For example, various values of the partial environment may be randomly changed to generate new environments.

An environment of the initial population is selected at step 310. Coverage, which represents the fitness of an environment, is calculated for the selected environment at step 312. Any other suitable measure of fitness, however, may be used. If there is a next environment at step 314, the method returns to step 310 to select the next environment. If there is no next environment the method proceeds to step 316. One or more most fit environments are determined at step 316.

Whether the fitness of any of the most fit environments is satisfactory or a predetermined iteration limit has been reached is determined at step 318. An environment may be determined to have a satisfactory fitness if, for example, the environment achieves a predetermined tag coverage threshold such as a threshold within the range of 65 to 75 percent tag coverage such as approximately 70 percent tag coverage. The iteration limit may be used to control the amount of time used to generate the next population of environments. If the fitness of the most fit environments is not satisfactory or if a predetermined iteration limit has not been reached, the method proceeds to step 320.

The most fit environments are mated to generate a next population of environments at step 320. According to one embodiment, two environments may be mated by, for example, combining a controllability portion of a first environment with an observability portion of a second environment to yield a first new environment, and combining the observability portion of the first environment with the controllability portion of the second environment in order to generate a second new environment. The mating may be restricted by one or more rules. For example, a rule may specify that a portion that does not propagate to an input or an output is not used in a new environment. Any other suitable method of mating environments, however, may be used.

After mating the most fit environments, the method returns to step 310, where an environment from the next population of environments is selected. If the fitness of the one or more environments is satisfactory or if an iteration limit has been reached at step 318, the method proceeds to step 322, where the results comprising the one or more most fit environments are reported. After reporting the results, the method terminates.

Modifications, additions, or omissions may be made to the method without departing from the scope of the invention. Additionally, steps may be performed in any suitable order without departing from the scope of the invention.

Certain embodiments of the invention may provide one or more technical advantages. A technical advantage of one embodiment may be that error propagation using an unsigned tag may provide for more accurate verification of a validation vector used for testing a circuit design. A technical advantage of another embodiment may be that validation vectors may be generated and evaluated at the register-transfer level. Evaluating validation vectors at the register-transfer level may be more efficient than evaluating the validation vectors at the logic level. A technical advantage of yet another embodiment may be that a genetic search process may be used to generate test environments for validation vectors.

Although an embodiment of the invention and its advantages are described in detail, a person skilled in the art could make various alterations, additions, and omissions without departing from the spirit and scope of the present invention as defined by the appended claims.

What is claimed is:

1. A method for generating a test environment, comprising:
   accessing an initial plurality of test environments for a network comprising a plurality of nodes, a test environment specifying a propagation path for a node of the plurality of nodes; and
   repeating the following until satisfactory coverage is achieved or until a predetermined number of iterations is reached:
   calculating a coverage for one or more validation vectors generated from each test environment of the plurality of test environments; and
   mating at least two of the test environments to generate a next plurality of test environments, the coverage of the at least two test environments greater than the coverage of the other test environments.

2. The method of claim 1, further comprising generating the initial plurality of test environments by:
   receiving a partial test environment; and
   placing one or more values in the partial test environment to generate a test environment of the initial plurality of test environments.

3. The method of claim 1, wherein calculating a coverage for each test environment of the plurality of test environments comprises:
   assigning a tag to a value of a variable of a node associated with a test environment, the tag representing an error of the value;
   propagating the tag to an output according to the propagation path associated with the test environment; and
   determining one or more other tags propagated to the output to calculate a coverage for the test environment.

4. The method of claim 1, wherein mating at least two of the test environments to generate a next plurality of test environments comprises:
   partitioning a first test environment into a first controllability portion and a first observability portion;
   partitioning a second test environment into a second controllability portion and a second observability portion; and
   combining the first controllability portion and the second observability portion to generate a test environment of the next plurality of test environments.

5. The method of claim 1, wherein mating at least two of the test environments to generate a next plurality of test environments comprises:
   partitioning a first test environment into at least two first portions;
   partitioning a second test environment into at least two second portions;
   determining that a first portion of the at least two first portions comprises an incomplete portion; and
   combining a second portion and the other first portion of the at least two first portions to generate a test environment of the next plurality of test environments.

6. A system for generating a test environment, comprising:
a database operable to store an initial plurality of test environments for a network comprising a plurality of nodes, a test environment specifying a propagation, path for a node of the plurality of nodes; and
a server system operable to repeat the following until satisfactory coverage is achieved or until a predetermined number of iterations is reached:
calculate a coverage for one or more validation vectors generated from each test environment of the plurality of test environments; and
mate at least two of the test environments to generate a next plurality of test environments, the coverage of the at least two test environments greater than the coverage of the other test environments.

7. The system of claim 6, the server system further operable to generate the initial plurality of test environments by:
receiving a partial test environment; and
placing one or more values in the partial test environment to generate a test environment of the initial plurality of test environments.

8. The system of claim 6, the server system operable to calculate a coverage for each test environment of the plurality of test environments by:
assigning a tag to a value of a variable of a node associated with a test environment, the tag representing an error of the value;
propagating the tag to an output according to the propagation path associated with the test environment; and
determining one or more other tags propagated to the output to calculate a coverage for the test environment.

9. The system of claim 6, the server system operable to mate at least two of the test environments to generate a next plurality of test environments by:
partitioning a first test environment into a first controllability portion and a first observability portion;
partitioning a second test environment into a second controllability portion and a second observability portion; and
combining the first controllability portion and the second observability portion to generate a test environment of the next plurality of test environments.

10. The system of claim 6, the server system operable to mate at least two of the test environments to generate a next plurality of test environments by:
partitioning a first test environment into at least two first portions;
partitioning a second test environment into at least two second portions;
determining that a first portion of the at least two first portions comprises an incomplete portion; and
combining a second portion and the other first portion of the at least two first portions to generate a test environment of the next plurality of test environments.

11. Computer readable medium encoded with instructions when executed operable to: access an initial plurality of test environments for a network comprising a plurality of nodes, a test environment specifying a propagation path for a node of the plurality of nodes; and repeat the following until satisfactory coverage is achieved or until a predetermined number of iterations is reached
calculate a coverage for one or more validation vectors generated from each test environment of the plurality of test environments;
mate at least two of the test environments to generate a next plurality of test environments, the coverage of the at least two test environments greater than the coverage of the other test environments.

12. The computer readable medium of claim 11, further operable to generate the initial plurality of test environments by:
receiving a partial test environment; and
placing one or more values in the partial test environment to generate a test environment of the initial plurality of test environments.

13. The computer readable medium of claim 11, operable to calculate a coverage for each test environment of the plurality of test environments by:
assigning a tag to a value of a variable of a node associated with a test environment, the tag representing an error of the value;
propagating the tag to an output according to the propagation path associated with the test environment; and
determining one or more other tags propagated to the output to calculate a coverage for the test environment.

14. The computer readable medium of claim 11, operable to mate at least two of the test environments to generate a next plurality of test environments by:
partitioning a first test environment into a first controllability portion and a first observability portion;
partitioning a second test environment into a second controllability portion and a second observability portion; and
combining the first controllability portion and the second observability portion to generate a test environment of the next plurality of test environments.

15. The computer readable medium of claim 11, operable to mate at least two of the test environments to generate a next plurality of test environments by:
partitioning a first test environment into at least two first portions;
partitioning a second test environment into at least two second portions;
determining that a first portion of the at least two first portions comprises an incomplete portion; and
combining a second portion and the other first portion of the at least two first portions to generate a test environment of the next plurality of test environments.

16. A system for generating a test environment, comprising:
means for accessing an initial plurality of test environments for a network comprising a plurality of nodes, a test environment specifying a propagation path for a node of the plurality of nodes; and
means for repeating the following until satisfactory coverage is achieved or until a predetermined number of iterations is reached:
calculating a coverage for one or more validation vectors generated from each test environment of the plurality of test environments; and
mating at least two of the test environments to generate a next plurality of test environments, the coverage of the at least two test environments greater than the coverage of the other test environments.

17. A method for generating a test environment, comprising:
accessing an initial plurality of test environments for a network comprising a plurality of nodes, a test environment specifying a propagation path for a node of the plurality of nodes, the initial plurality of test environments generated by receiving a partial test environment, and by placing one or more values in the partial test environment to generate a test environment of the initial plurality of test environments; and repeating the following until satisfactory coverage is achieved or until a predetermined number of iterations is reached:

calculating a coverage for one or more validation vectors generated from each test environment of the plurality of test environments by assigning a tag to a value of a variable of a node associated with a test environment, the tag representing an error of the value, by propagating the tag to an output according to the propagation path associated with the test environment, and by determining one or more other tags propagated to the output to calculate a coverage for the test environment; and mating at least two of the test environments to generate a next plurality of test environments, the coverage of the at least two test environments greater than the coverage of the other test environments, by:

partitioning a first test environment into a first controllability portion and a first observability portion, partitioning a second test environment into a second controllability portion and a second observability portion, and combining the first controllability portion and the second observability portion to generate a test environment of the next plurality of test environments; and partitioning a first test environment into at least two first portions, partitioning a second test environment into at least two second portions, determining that a first portion of the at least two first portions comprises an incomplete portion, and combining a second portion and the other first portion of the at least two first portions to generate a test environment of the next plurality of test environments.

* * * * *

UNITED STATES PATENT AND TRADEMARK OFFICE
CERTIFICATE OF CORRECTION

PATENT NO. : 7,139,929 B2 Page 1 of 1
APPLICATION NO. : 10/405768
DATED : November 21, 2006
INVENTOR(S) : Indradeep Ghosh et al.

It is certified that error appears in the above-identified patent and that said Letters Patent is hereby corrected as shown below:

Column 8, Line 22, after "inputs" delete "in a" and insert -- ina --.
Column 8, Line 23, after "input" delete "in a" and insert -- ina --.
Column 8, Line 24, after "input" delete "in a" and insert -- ina --.
Column 8, Line 32, after "inputs" delete "in a" and insert -- ina --.

Signed and Sealed this

Fourteenth Day of October, 2008

JON W. DUDAS
*Director of the United States Patent and Trademark Office*